United States Patent
Aiba et al.

(10) Patent No.: US 8,422,230 B2
(45) Date of Patent: Apr. 16, 2013

(54) POWER CONVERTER

(75) Inventors: Tsukasa Aiba, Tochigi (JP); Hitoshi Saika, Tochigi (JP); Yasuhiko Kondo, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 229 days.

(21) Appl. No.: 13/011,478

(22) Filed: Jan. 21, 2011

(65) Prior Publication Data
US 2011/0188279 A1 Aug. 4, 2011

(30) Foreign Application Priority Data

Jan. 29, 2010 (JP) ................. 2010-018516

(51) Int. Cl.
*H05K 7/20* (2006.01)
*H02M 1/00* (2007.01)

(52) U.S. Cl.
USPC ............. 361/704; 361/679.46; 361/679.54; 361/714; 165/80.3; 165/104.33; 165/185; 363/65; 363/137; 363/141; 363/143

(58) Field of Classification Search ........... 361/679.46, 361/679.47, 679.53, 679.54, 689, 690–697, 361/699, 721–728, 734, 760, 766, 768; 165/80.2, 165/80.3, 80.4, 80.5, 104.33, 104.34, 121–126, 165/185; 174/15.1, 16.3, 252; 257/706–727, 257/E23.186, E23.044, E23.001; 307/11, 307/38, 42, 43, 104, 115; 363/141–147, 363/65, 137, 56.02, 178; 29/592.1, 740, 29/741, 759, 602.1, 831, 832
See application file for complete search history.

(56) References Cited

U.S. PATENT DOCUMENTS

| | | | | |
|---|---|---|---|---|
| 5,844,386 A * | 12/1998 | Matsuoka et al. | ............ | 318/293 |
| 6,522,544 B1 * | 2/2003 | Kimoto et al. | ................ | 361/704 |
| 6,762,937 B2 * | 7/2004 | Kimoto et al. | ................ | 361/699 |
| 6,900,986 B2 * | 5/2005 | Kimoto et al. | ................ | 361/704 |
| 7,081,671 B2 * | 7/2006 | Fukada et al. | ................ | 257/714 |
| 7,961,487 B2 * | 6/2011 | Seto et al. | ..................... | 363/132 |
| 2004/0179341 A1 * | 9/2004 | Kimoto et al. | ................ | 361/704 |

FOREIGN PATENT DOCUMENTS

| | | |
|---|---|---|
| JP | 2004-104860 A | 4/2004 |
| JP | 2009-111435 A | 5/2009 |

* cited by examiner

*Primary Examiner* — Michail V Datskovskiy
(74) *Attorney, Agent, or Firm* — Arent Fox LLP

(57) ABSTRACT

A power converter including a switching element, a switching power module containing a driving circuit for driving the switching element, a smoothing capacitor module for smoothing an input to the switching power module, and a heat sink for cooling the switching power module, wherein the switching power module is mounted on the heat sink, and the smoothing capacitor module is provided on a side surface of the heat sink.

4 Claims, 9 Drawing Sheets

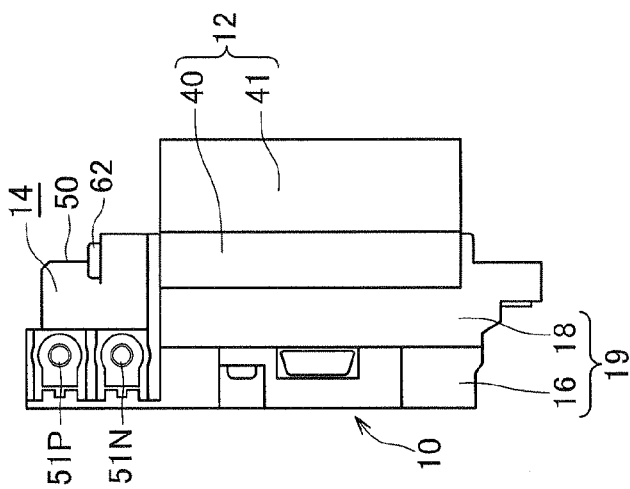
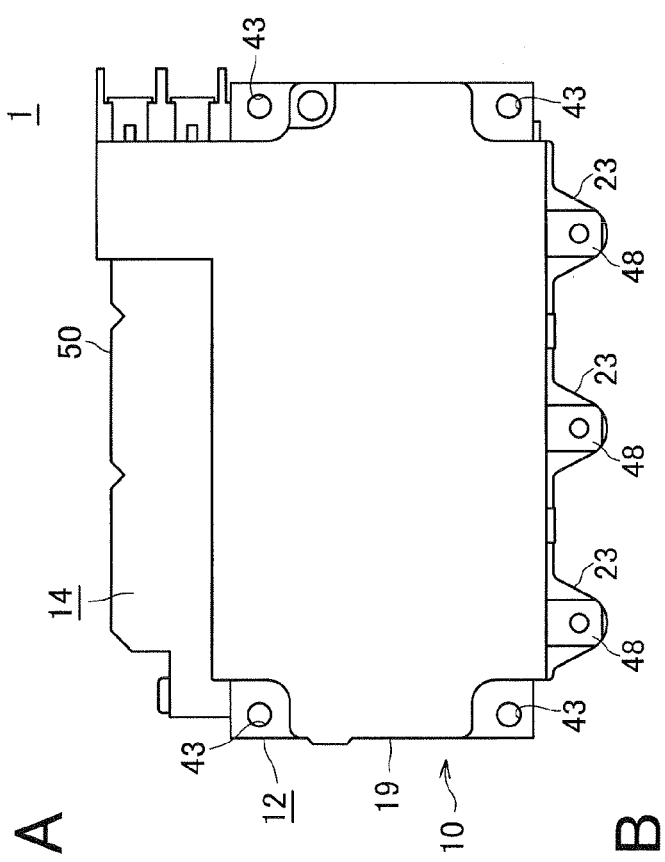
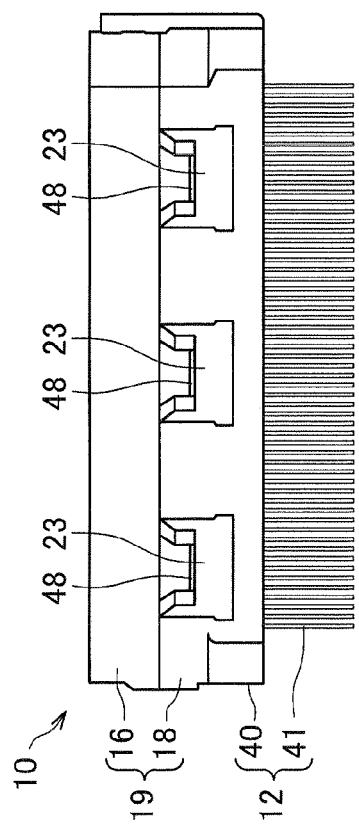

POWER CONVERTER

INCORPORATION BY REFERENCE

The present application claims priority under 35 U.S.C. §119 to Japanese Patent Application No. 2010-018516 filed on Jan. 29, 2010. The content of the application is incorporated herein by reference in its entirety.

BACKGROUND OF THE INVENTION

1. Field of the Invention

The present invention relates to a power converter for converting DC current supplied from a DC power source to AC current, and particularly to a layout structure of the power converter.

2. Description of Related Art

Recently, a power converter for converting DC current of a DC power source to AC current and providing the DC current to loads such as a motor as a driving source, etc. is mounted in a vehicle such as a train, an automobile or the like. FIG. 9 shows an example of a conventional power converter 100. The power converter 100 has a switching element which can perform switching of large current, and a switching power module 110 which has a driving circuit for driving the switching element, etc. and is constructed in a box-shape so as to be mounted on a heat sink 112.

Furthermore, the power converter 100 has a smoothing capacitor module 114 for suppressing voltage variation of the DC power source at the switching time to smooth surge of the voltage, and the smoothing capacitor module 114 is mounted on the heat sink 112 so that the smoothing capacitor module 114 and the switching power module 110 are disposed side by side (for example, see JP-A-2004-104860).

The smoothing capacitor module 114 is not necessarily required to be cooled, but it is sufficient to cool the switching power module 110. Therefore, the heat sink 112 may be designed to have an area which is the same level as the switching power module 110. However, in the conventional construction, the mount face (space) of the heat sink 112 must be designed to be larger by the amount corresponding to the mount space for the smoothing capacitor module 114. Therefore, the power converter 100 has been designed to be puffed up in each of weight, cost, volume and height dimension.

Accordingly, there has been hitherto proposed a power converter in which the area of the mount face of the heat sink 112 is reduced by stacking the smoothing capacitor module 114 on the switching power module 110 (for example, see JP-A-2009-111435).

However, when the smoothing capacitor module 114 is stacked on the switching power module 110, the height dimension is designed to be large in scale. Furthermore, the distance L from the smoothing capacitor module 114 to the switching power module 110 is longer, and thus the inductance is increased. Accordingly, a surge voltage occurring at the switching time of the switching power module 110 is increased, which causes breaking of the switching power module 110.

SUMMARY OF THE INVENTION

The present invention has been implemented in view of the foregoing situation, and has an object to provide a power converter that can be designed to be compact by suppressing the distance and height dimension from a smoothing capacitor module to a switching power module.

In order to attain the above object, a power converter comprises: a switching power module containing a switching element and a driving circuit for driving the switching element; a smoothing capacitor module for smoothing an input to the switching power module; and a heat sink for cooling the switching power module, wherein the switching power module is mounted on the heat sink, and the smoothing capacitor module is provided on a side surface of the heat sink.

According to the power converter of the present invention, the smoothing capacitor module is mounted on the side surface of the heat sink, and thus the height of the layout of this invention can be reduced to be less than the layout that the smoothing capacitor module is stacked on the heat sink. Furthermore, the heat sink is not required to secure an area (space) for mounting the smoothing capacitor module, so that the heat sink can be made compact and the volume, weight and cost of the power converter can be reduced.

Furthermore, as compared with the construction that the smoothing capacitor module is stacked on the switching power module, the distance from the smoothing capacitor module to the switching power module is not increased, and thus the increase of the inductance can be suppressed.

In the power converter described above, the smoothing capacitor module has an anode and a cathode that are arranged in a vertical direction, the anode is provided with a P bus bar, the cathode is provided with an N bus bar, each of the P bus bar and the N bus bar is provided with a connection terminal unit for connecting each of the P bus bar and the N bus bar to the switching power module, and the connection terminal units are disposed at the middle point between the anode and the cathode.

According to the power converter described above, the layout of the P bus bar and the N bus bar is symmetric with respect to the middle point between the anode and the cathode. Therefore, the P bus bar and the N bus bar can be designed to have the same shape, and thus a common metal mold can be used, so that the manufacturing cost can be reduced. Furthermore, when the P bus bar and the N bus bar are arranged to be asymmetric with respect to the connection terminal units, there is a tendency that one of the P bus bar and the N bus bar becomes larger (the path from the anode, the cathode to the connection terminal unit is longer), so that the cost for materials increases, the yield of the materials is deteriorated and the inductances of the connection terminal units are different from each other. However, according to the present invention, neither the deterioration of the yield for the materials nor the difference in inductance as described above occur.

In the above power converter, the smoothing capacitor module has a capacitor unit and a case body in which the capacitor unit is mounted, the case body is provided with an insertion opening through which the capacitor unit is inserted, and a bolt hole that penetrates in parallel to the depth direction of the insertion opening and through which the smoothing capacitor module is fastened to the heat sink.

According to the power converter described above, the depth direction of the insertion opening formed in the case body and the penetration direction of the bolt hole are parallel to each other, and thus the metal mold used to mold the case body is simple, so that the manufacturing cost can be suppressed.

In the power converter described above, the case body is provided with a positioning and holding projecting member that projects in parallel to the depth direction of the insertion opening and is fitted in a positioning hole formed in a side surface of the heat sink to be held.

According to the power converter described above, the depth direction of the insertion opening formed in the case body, the penetration direction of the bolt hole and the projecting direction of the positioning and holding projecting member are parallel to one another. Therefore, the metal mold in the metal molding process of the case body is simple, so that the manufacturing cost can be reduced.

Furthermore, the positioning and holding projecting member is provided to the case body, and thus a member for temporarily fixing the smoothing capacitor module as another step is unnecessary, so that the manufacturing cost can be reduced.

According to the present invention, the smoothing capacitor module is provided to the side surface of the heat sink, and thus the height can be more greatly reduced as compared with the layout that the smoothing capacitor module is mounted on the heat sink. Furthermore, the area (space) for mounting the smoothing capacitor module is not required to be secured in the heat sink, so that the heat sink can be miniaturized and thus the volume, weight and cost of the power converter can be reduced.

Still furthermore, as compared with the construction that the smoothing capacitor module is stacked on the switching power module, the distance from the smoothing capacitor module to the switching power module does not increase, so that the increase of the inductance can be suppressed.

Here, by establishing the layout of the P bus bar and the N bus bar so that the they are arranged symmetrically with respect to the middle point between the anode and the cathode of the smoothing capacitor module, the same shape can be applied to the P bus bar and the N bus bar, and thus a common metal mold can be used, resulting in reduction of the manufacturing cost. Furthermore, when the P bus bar and the N bus bar are asymmetrical with each other with respect to the connection terminal units, there is a tendency that one of them becomes larger (the length of the path from the anode, the cathode to the connection terminal unit increases). Therefore, so that the cost for materials increases, the yield of the materials is deteriorated and the inductances of the connection terminal units are different from each other. However, according to the present invention, neither the deterioration of the yield for the materials nor the difference in inductance as described above occur.

Furthermore, the smoothing capacitor module is configured to have the capacitor unit and the case body in which the capacitor unit is accommodated, the case body is provided with the insertion opening through which the capacitor unit is inserted, and the bolt hole that penetrates in parallel to the depth direction of the insertion opening and used for fastening to the heat sink, so that the metal mold used in the metal molding processing of the case body is simple and thus the manufacturing cost can be reduced.

Still furthermore, the case body is provided with a positioning and holding projecting member that projects in parallel to the depth direction of the insertion opening and is fitted in a positioning hole formed in a side surface of the heat sink to be held. Therefore, the depth direction of the insertion opening formed in the case body, the penetration direction of the bolt hole and the projecting direction of the positioning and holding projecting member are parallel to one another. Therefore, the metal mold in the metal molding process of the case body is simple, so that the manufacturing cost can be reduced. Furthermore, the positioning and holding projecting member is provided to the case body, and thus a member for temporarily fixing the smoothing capacitor module as another step is unnecessary, so that the manufacturing cost can be reduced.

BRIEF DESCRIPTION OF THE DRAWINGS

FIG. 1A is a plan view of a power converter according to an embodiment of the present invention, FIG. 1B is a front view of the power converter, and FIG. 1C is a side view of the power converter;

DETAILED DESCRIPTION OF THE PREFERRED EMBODIMENT

A preferred embodiment according to the present invention will be described hereunder with reference to the accompanying drawings.

Figure 2:
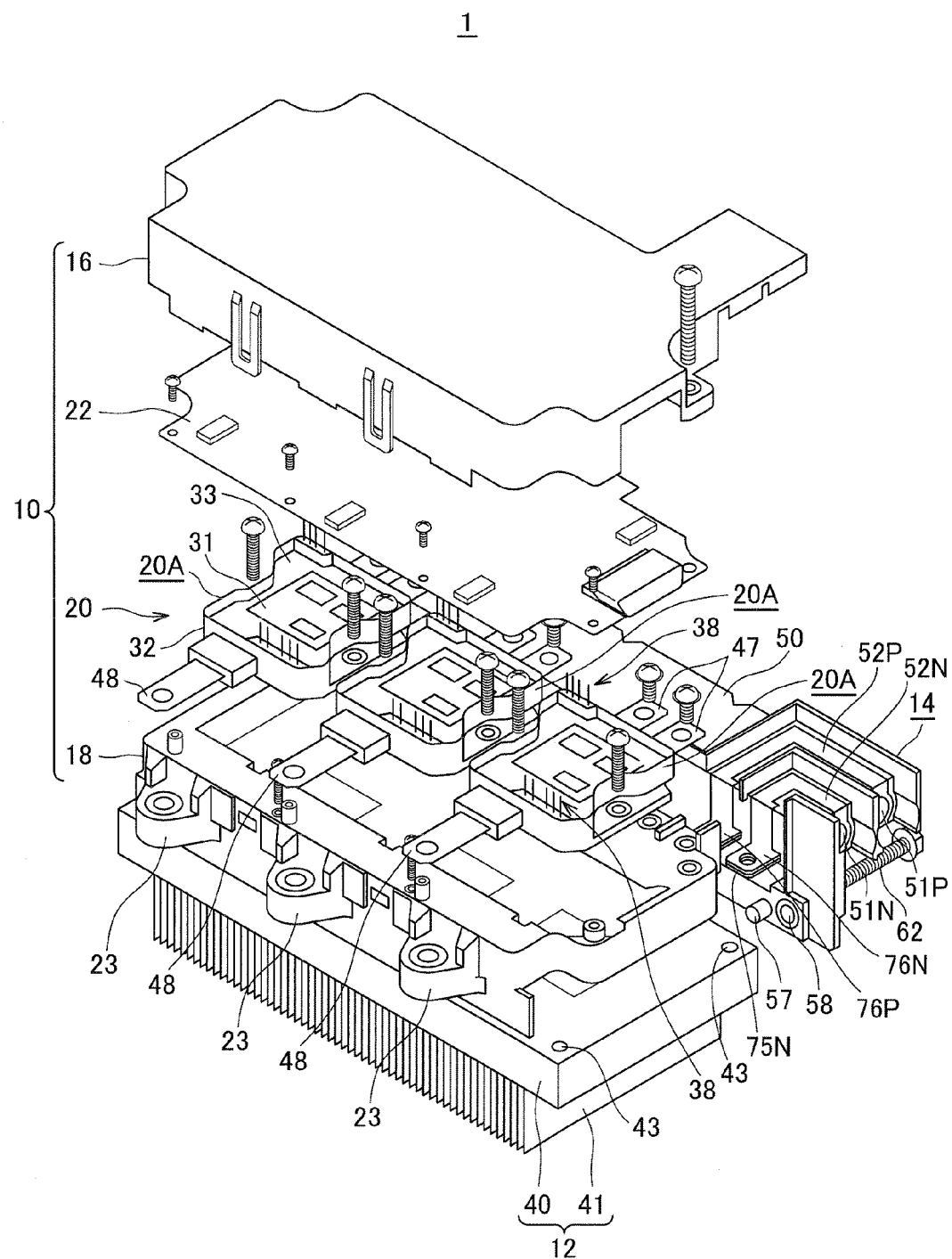
FIG. 2 is an exploded perspective view showing the power converter.
Figure 3:
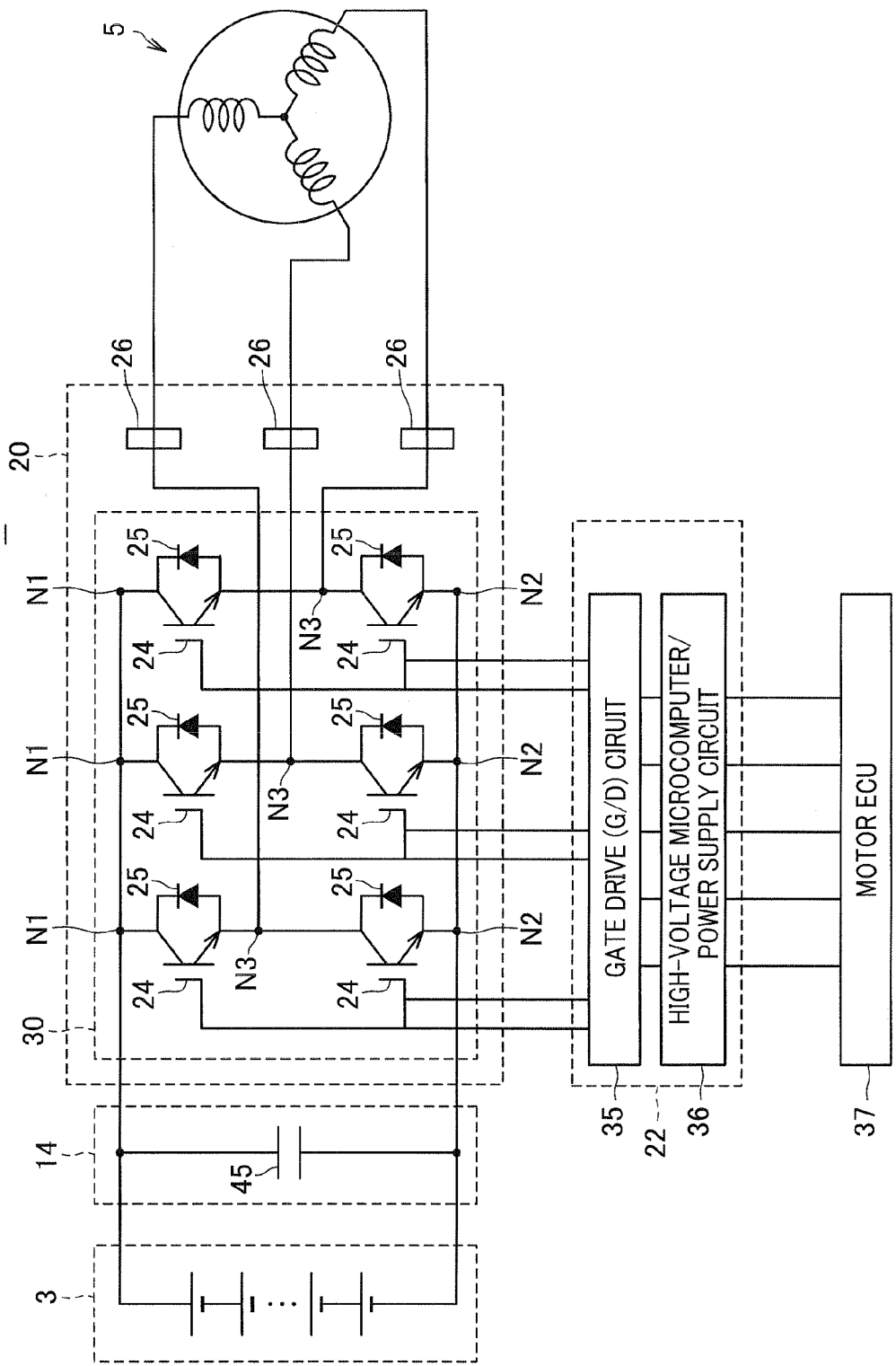
FIG. 3 is an electrical circuit diagram of the power converter.

FIGS. 1A to 1C are diagrams showing the construction of a power converter according to an embodiment of the present invention, wherein FIG. 1A is a plan view, FIG. 1B is a front view and FIG. 1C is a side view. FIG. 2 is an exploded perspective view of the power converter 1, and FIG. 3 is a diagram showing an electrical circuit of the power converter 1.

The power converter 1 is an in-vehicle mount type device for converting DC current of a DC power source 3 (FIG. 3) mounted in a vehicle such as a train, an automobile (car) to AC current and supplying the AC current to a three-phase induction motor 5 (FIG. 3) as a driving source mounted in the vehicle to drive the motor 5. As shown in FIG. 1, it has a switching power module 10, a heat sink 12 and a smoothing capacitor module 14.

The switching power module 10 is a module in which an electrical circuit for converting DC current to AC current. As shown in FIG. 2, the switching power module 10 has a box-shaped case body 19 comprising an upper cover 16 and a lower cover 18, and a pre-driver board 22 in which a semiconductor module 20 containing a three-phase inverter circuit 30 (FIG. 3) and an electrical circuit for driving the three-phase inverter circuit 30 are mounted is disposed in the case body 19.

The upper cover 16 prevents invasion of dirt or dust into the electrical circuit portion of the semiconductor module 20 and the pre-driver board 22, and the lower cover 18 covers the periphery of the semiconductor module 20 to insulate the semiconductor module 20 from the external. An input/output terminal 23 for connection of the three-phase induction motor of the vehicle is provided to the outer side surface of the lower cover 18. The upper cover 16 and the low cover 18 are formed of a resin member having heat resistance and insulation properties.

As shown in FIG. 3, the three-phase inverter circuit 30 comprises two switching elements 24 which are connected to each other in series, and flywheel diodes 25 each of which is connected to each of the switching elements 24 in an antiparallel (back-to-back) connection style. A node N1 at one end side of the two switching elements which are connected to each other in series is connected to the positive side of the DC power source 3, and a node N2 at the other end side is connected to the negative side of the DC power source 3, whereby the connection point N3 between the two switching elements 24 serves as a terminal for an AC output of one phase. The three-phase inverter circuit 30 is provided with three pairs of two series-connected switching elements 24 which are arranged in parallel so as to obtain AC outputs of three phases necessary to drive the three-phase induction motor 5, and AC output terminals of three phases are constructed by the connection points N3 of the respective pairs. A current sensor 26 supplied for feedback control is provided to each of these connection points N3. IGBT, MOSFET or the like may be used as the switching element 24.

As shown FIG. 2, the three-phase inverter circuit 30 is divided and packaged into three packages 20A each of which is constructed every circuit of one-phase AC output, and these packages 20A are arranged side by side to construct the semiconductor module 20. In each package 20A, a circuit board 31 for one-phase AC output on which the two switching elements 24, the flywheel diodes 25 and the current sensor 26 are mounted is accommodated in the case body 32, and the circuit board 31 is sealed by a resin member 33. A pair of DC input terminals 47 corresponding to the nodes N1, N2 are provided to one side surface of each package 20A, and an AC input/output terminal 48 corresponding to the connection point N3 is provided to the opposite side surface of each package 20A. The respective packages 20A are arranged on the heat sink 12 so that the DC input terminals 47 thereof are placed to the same side.

Furthermore, the lower cover 18 has an opened bottom surface, and when each package 20A is disposed on the heat sink 12, the lower cover 18 is directly fixed to the heat sink 12 by screws and cooled.

As shown in FIG. 3, the pre-driver board 22 comprises a gate drive circuit 35, and a driver controller 36 having a power supply circuit for supplying power to a high-voltage microcomputer and the respective parts of the pre-driver board 22.

The gate drive circuit 35 is a circuit for making each switching element 24 of the three-phase inverter circuit 30 execute switching operation. The high-voltage microcomputer drives the gate drive circuit on the basis of a control signal output from a motor ECU (electronic control unit) 37 mounted at the vehicle side, whereby the three-phase induction motor 5 is driven in accordance with the control of the vehicle side.

As shown in FIG. 2, the pre-driver board 22 is fixed to the lower cover 18 by screws so as to cover the whole of each of the packages 20A which are arranged side by side on the heat sink 12, and electrically connected to these packages 20A through pin type connection portions 38. The lower cover 18 is fixed through screws to predetermined positions on the heat sink at which the connection portions 38 of the pre-driver board 22 are fitted to predetermined connectors of the respective packages 20A, whereby the pre-driver board 22 is positioned.

As shown in FIGS. 1 and 2, the heat sink 12 is constructed by providing many heat radiation fins 41 on the lower surface of a top plate 40, and it can be fixed to the vehicle by inserting bolts into bolt fixing hole portions 43 provided at the four corners of the top plate 40. Any material may be used as the materials of the top plate 4 and the heat radiation fins 41 insofar as they have excellent thermal conductivity and sufficient rigidity to the extent that they can endure the weight of the switching power module 10 and the smoothing capacitor module 14.

As described above, the switching power module 10 (more accurately, the lower cover 18 and the respective packages 20A) is fixed to the upper surface of the top plate 40, and the top plate 40 is used as a fixing base for the switching power module 10. As shown in FIG. 1, the dimension of the upper surface of the top plate 40 is substantially equal to the dimension of the bottom surface of the case body 19 of the switching power module 10, and it has a sufficient size to the extent that the whole bottom surface of the case body 18 is brought into contact with the upper surface of the top plate 40.

Furthermore, the heat radiation fins 41 are arranged so as to form an air flowing path for cooling air in a direction which is substantially orthogonal to the arrangement direction of the respective packages 20A so that the respective packages 20A have the same cooling performance as shown in FIG. 3.

As shown in FIG. 3, the smoothing capacitor module 14 has a capacitor 45 which is provided at the input stage of the three-phase inverter circuit 30 in parallel to the DC power source 3, and it suppresses voltage variation of the DC power source 3 at the switching time of the three-phase inverter circuit 30, and smoothens surge (popping), etc. of the voltage.

Figure 4:
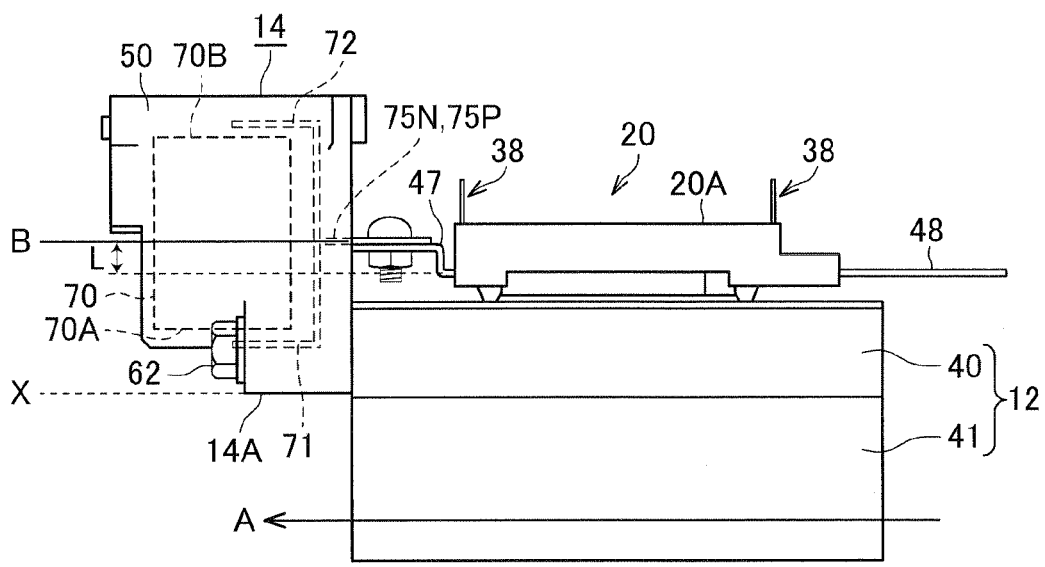
FIG. 4 is a side view of the power converter under a state that a case body is detached from a switching power module.
Figure 5:
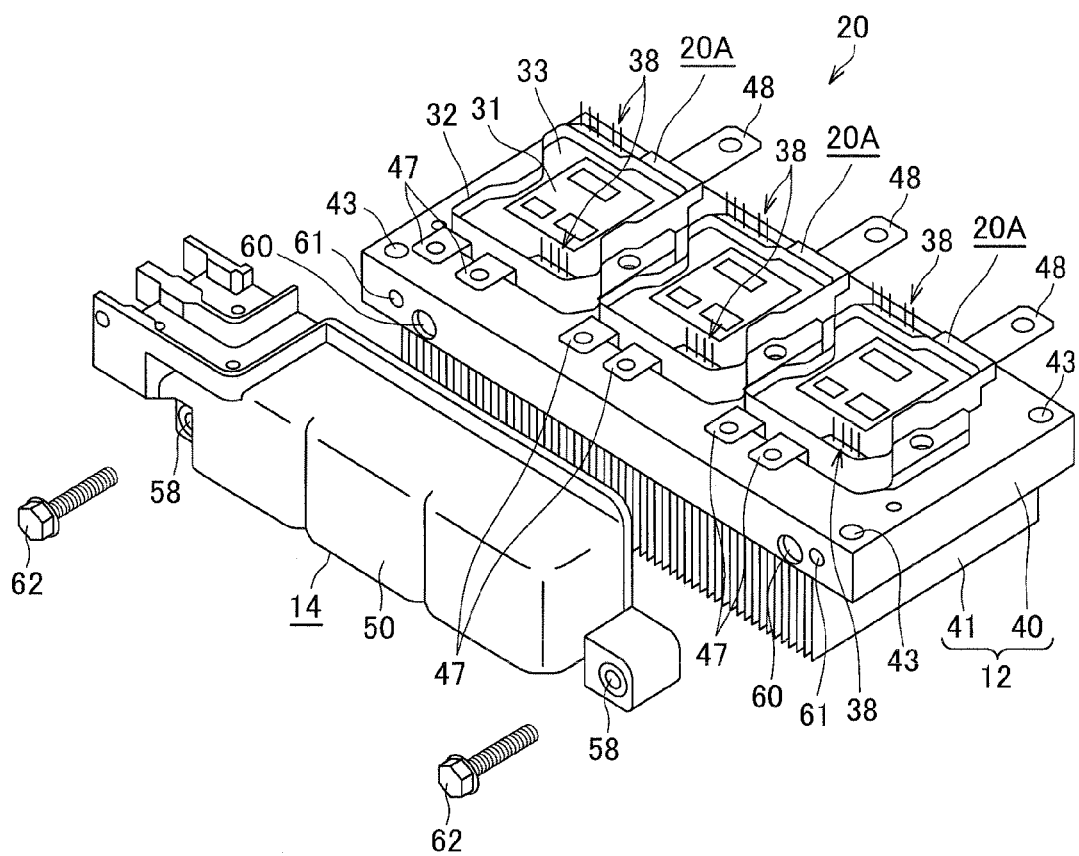
FIG. 5 is a fabrication diagram of the power converter shown in FIG. 4.

FIG. 4 is a side view of the power converter 1 in which the semiconductor module 20 and the smoothing capacitor module 14 are assembled to the heat sink 12, and FIG. 5 is a diagram showing fabrication of the power converter 1.

The smoothing capacitor module 14 has a box-shaped case body 50 extending over the respective packages 20A arranged side by side on the heat sink 12, and is fixed through screws to a side surface of the top plate 40 of the heat sink 12 at which the DC input terminals 47 of the semiconductor module 20 are arranged as shown in FIG. 4.

The smoothing capacitor module 14 is provided to the side surface of the heat sink 12, and thus the height thereof can be reduced to be less as compared with the layout that the smoothing capacitor module 14 is mounted on the heat sink 12. Furthermore, it is unnecessary to secure the space for mounting the smoothing capacitor module 14 on the top plate of the heat sink 12, so that the heat sink 12 can be miniaturized and the volume, weight and cost of the power converter 1 can be reduced.

Figure 6:
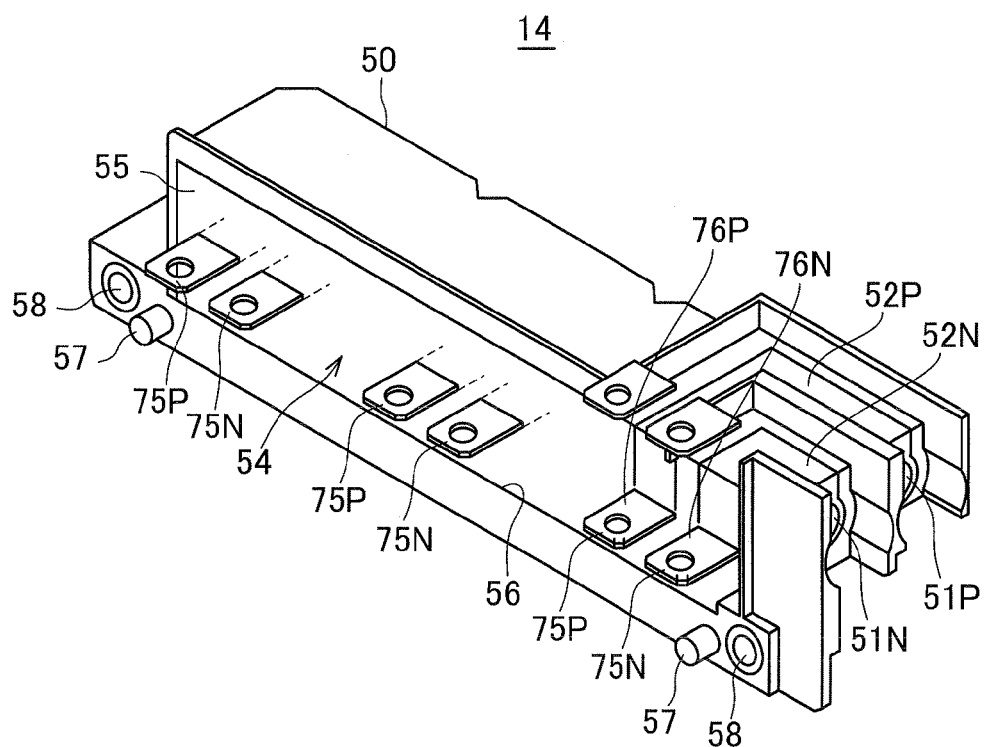
FIG. 6 is a perspective view showing a smoothing capacitor module.
Figure 7:
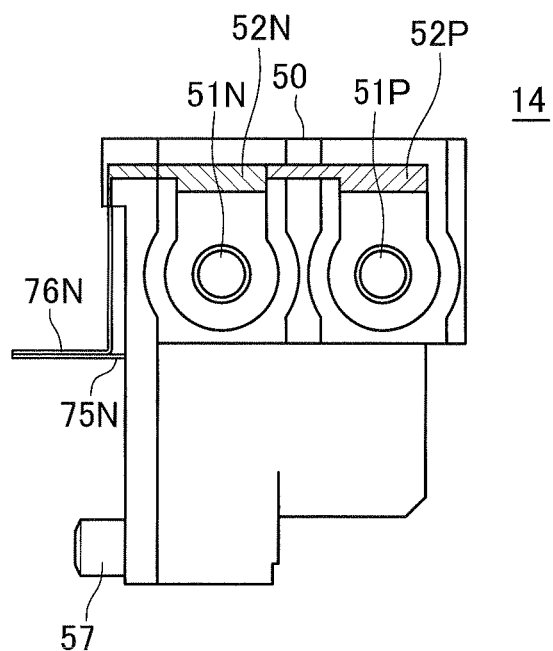
FIG. 7 is a side view showing the smoothing capacitor module.
Figure 8:
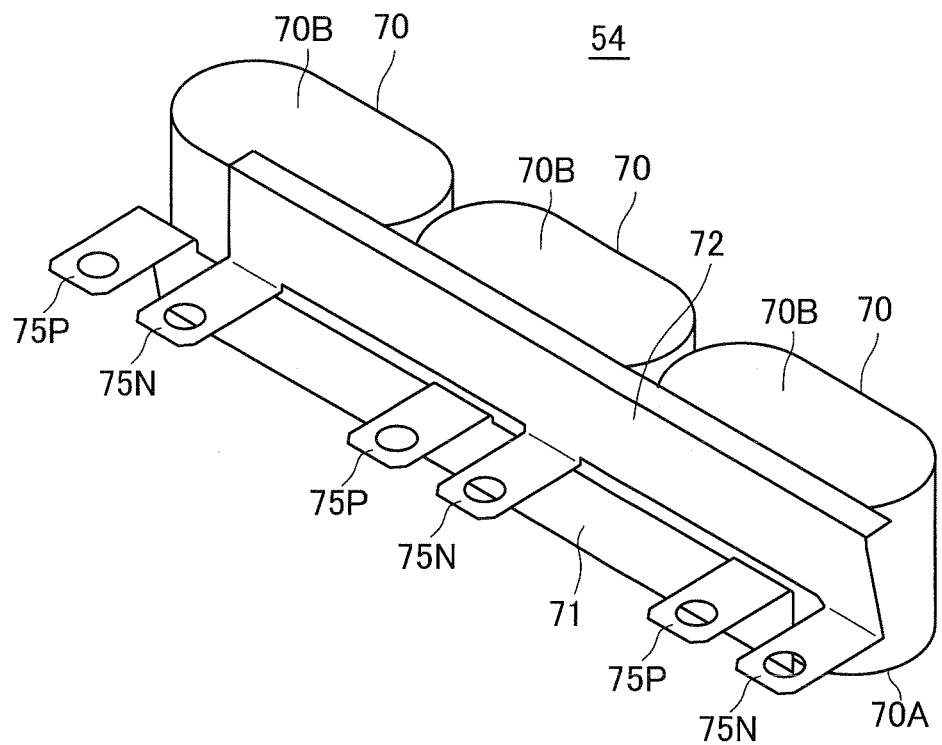
FIG. 8 is a perspective view showing the construction of a capacitor unit.
Figure 9:
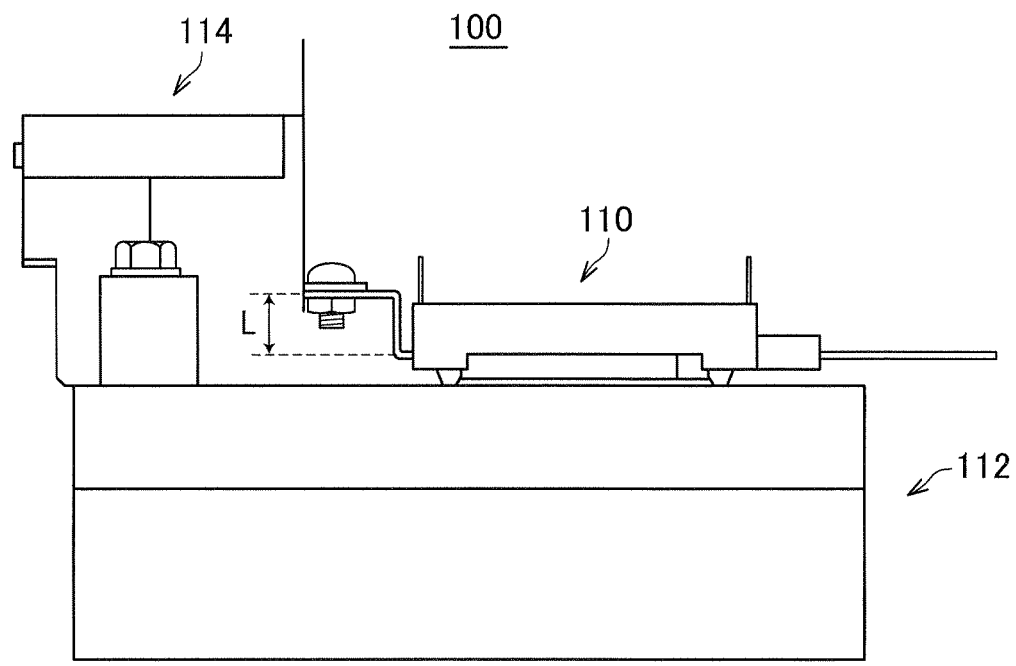
FIG. 9 is a diagram showing an example of a conventional power converter.

FIG. 6 is a perspective view of the smoothing capacitor module 14, FIG. 7 is a side view of the smoothing capacitor module 14, and FIG. 8 is a perspective view showing the construction of a capacitor unit 54 mounted in the smoothing capacitor module 14.

As shown in FIG. 6, the smoothing capacitor module 14 is constructed by mounting the capacitor unit 54 in the box-shaped case body 50 provided with an insertion opening 56 in a side surface of the case body 50 under the state that connection terminals portions 75N, 75P are projected from the insertion opening 56 and sealing the case body 50 with a resin member 55. The case body 50 is provided with N bus bar 52N and a P bus bar 52P having terminals 51N, 51P connected to the DC power source 3 at one end portion in the extending direction of the case body 50. The terminals 76N, 76P at the other end of the N bus bar 52 and the P bus bar 52P are provided so as to be overlapped with one pair of connection terminal portions 75N, 75P, and fastened and fixed to the DC input terminals 47 together with the connection terminal portions 75N, 75P. Positioning and holding projecting portions 57 and bolt holes 58 are provided at both the sides of the insertion opening 56. As shown in FIG. 5, positioning holes 60 in which the positioning and holding projecting portions 57 are fitted and fastening bolt holes 60 in which fastening bolts 62 inserted through the bolt holes 58 of the case body 50 are threadably fitted are provided on the side surface of the top plate 40 of the heat sink 12.

When the smoothing capacitor module 14 is assembled to the heat sink 12, the case body 50 is fastened to the top plate 40 from the side of the top plate 40 by the fastening bolts 62 under the state that the insertion opening 56 of the case body 50 is disposed to face the side surface of the top plate 40 of the heat sink 12 and the positioning and holding projecting portions 57 are fitted and held in the positioning holes 60.

The case body 50 is formed by metal molding, and with respect to the above fixing structure, the pull-out direction (depth direction of the insertion opening 56 of the case body 50, the extending direction of the positioning and holding projecting portion 57 and the penetration direction of the bolt holes 58 through which the fastening bolts 62 pass are the same direction, and thus the metal mold used to mold the case body 50 can be simplified, and thus the manufacturing cost can be reduced.

Furthermore, the positioning and holding projecting portion 57 is provided to the case body 50, and it is unnecessary to separately provide a position member for positioning the smoothing capacitor module 14 to the top plate 40, so that the cost can be further reduced.

In addition, when the smoothing capacitor module 14 is assembled to the heat sink 12, the positioning and holding projecting portions 57 of the case body 50 are engagedly fitted and held in the positioning holes 60, whereby the smoothing capacitor module 14 can be temporarily positioned to a predetermined position and thus the smoothing capacitor module 14 can be prevented from falling off, so that the productivity can be enhanced. Furthermore, it is unnecessary to provide a member for temporarily fixing the smoothing capacitor module and thus the manufacturing cost can be suppressed.

Furthermore, the screw-fixing holes for the respective packages 20A of the semiconductor module 20 are located on the upper surface of the heat sink 1, however, the fastening bolt holes 61 for the smoothing capacitor module 14 are located on the side surface. Therefore, in the assembling process shown in FIG. 5, even when the fastening bolts 62 of the smoothing capacitor module 14 fall off, they are prevented from invading into the packages 20A and thus the manufacturing reliability is enhanced.

Here, as shown in FIG. 4, the smoothing capacitor module 14 is disposed to be orthogonal to a cooling air flowing direction A based on the heat radiation fins 41 of the heat sink 12. Therefore, the cooling air flowing path is more greatly blocked by the smoothing capacitor module 14 as the lower end 14A of the smoothing capacitor module 14 invades into the heat radiation fins 41 more deeply, so that the cooling performance is disturbed. Therefore, in this construction, the lower end 14A of the smoothing capacitor module 14 is fixed to be located at a height position X which is substantially equal to the height position of the bottom surface of the top plate 40 of the heat sink 12, and thus the cooling air flowing path is prevented from being blocked.

As shown in FIG. 8, in the capacitor unit 54 of the smoothing capacitor module 14, plural capacitor cells 70 are juncturally arranged on a line, and a P bus bar 71 as an anode conductor and an N bus bar 72 as a cathode conductor are fixed so as to traverse each capacitor cell 70. The capacitor cells 70 are juncturally arranged so that the anodes 70A and 70B are oriented face up and down in the vertical direction, and connection terminal portions 75N, 75P to the semiconductor module 20 are formed in the N bus bar 72 and the P bus bar 71 respectively so as to extend from the side surface of the capacitor unit 54 in the horizontal direction.

In this construction, as shown in FIG. 4, the respective connection terminal portions 75N, 75P are provided substantially at the middle point B in the height direction of the capacitor cells 70. Therefore, the layout of the P bus bar 71 and the N bus bar 72 is symmetric with respect to the capacitor cells (when viewed from the middle point B), and thus bus bars having the same shape can be used for both the P bus bar and the N bus bar. Accordingly, a common metal mold can be used and thus the manufacturing cost can be reduced. When the layout of the P bus bar 71 and the N bus bar 72 are asymmetric with respect to the capacitor cells 70, there is a tendency that one of them is larger (the path from the anode 70A, the cathode 70B to the connection terminal portions 75N, 75P is longer), so that the material cost is increased, the material yield is deteriorated, and some difference occurs in inductance between the connection terminal portions 75N, 75P. However, according to this embodiment, the deterioration of the material yield and the difference in inductance as described above do not occur.

As shown in FIG. 4, the DC input terminals 47 of the semiconductor module 20 are connected to the connection terminal portions 75N,75P of the smoothing capacitor module 14, and the smoothing capacitor module 14 is fixed to the side surface of the heat sink 12, whereby the connection terminal portions 75N, 75P and the DC input terminal 47 can be disposed so as to face each other. Accordingly, the length of the wire path from the smoothing capacitor module 14 to the semiconductor module 20 can be shortened. Particularly, the smoothing capacitor module 14 is fixed to the side surface of the heat sink 12 so that the height position of the connection terminal portions 75N, 75P is substantially equal to the height position of the DC input terminals 47 of the semiconductor module 20, whereby the length L of the wire path (L) from the smoothing capacitor module 14 to the semiconductor module 20 (FIG. 4) can be made shortest. Accordingly, the parasitic inductance between the smoothing capacitor module 14 and the semiconductor module 20 is reduced and thus the switching surge of the semiconductor is reduced, so that the reliability of the semiconductor can be enhanced and the loss can be also reduced.

Furthermore, even when the connection terminal portions 75N, 75P of the smoothing capacitor module 14 are fixed to the DC input terminals 47 of the semiconductor module 20 substantially at the same height position, the height dimension of the smoothing capacitor module 14 is set so that the height position X of the lower end 14A of the smoothing capacitor module 14 is set to be substantially equal to the height position of the bottom surface of the top plate 40 of the heat sink 12, so that the cooling air flow path of the heat sink 12 is not blocked by the smoothing capacitor module 14.

As described above, according to this embodiment, the smoothing capacitor module 14 is provided to the side surface of the heat sink 12, so that the height of the smoothing capacitor module 14 can be lowered as compared with the layout that the smoothing capacitor module 14 is mounted on the heat sink. Furthermore, it is unnecessary to secure the space for mounting the smoothing capacitor module 14 on the top plate 40 of the heat sink 12, so that the heat sink 12 can be miniaturized and the volume, weight and the cost of the power converter 1 can be reduced.

As compared with the construction that the smoothing capacitor module 14 is stacked on the switching power module 10, the distance from the smoothing capacitor module 14 to the switching power module 10 does not extend, and thus the increase of the inductance is suppressed.

According to this embodiment, the anode 70a and the cathode 70B of the smoothing capacitor module 14 are placed face up and down, and the connection terminal portions 75N, 75P provided to the N bus bar 72 and the P bus bar 71 respectively are arranged at the middle point B between the anode 70A and the cathode 70B. Accordingly, the layout of the P bus bar 71 and the N bus bar 72 are symmetric with respect to the middle point B, so that a bus bar having the same shape can be commonly used for the P bus bar 71 and the N bus bar 72 and thus a common metal mold can be used. Therefore, the manufacturing cost can be reduced. Furthermore, when the N bus bar 72 and the P bus bar 71 are asymmetrically arranged with respect to the connection terminal portions 75N, 75P, there is a tendency that one of them is larger (the path from the anode 70A, the cathode 70B to the connection terminal portions 75N, 75P is longer), so that the material cost is increased, the material yield is also deteriorated and some difference occurs in inductance between the connection terminal portions 75N, 75P. However, according to the construction of this embodiment, the deterioration of the material yield and the difference in inductance as described above do not occur.

According to this embodiment, the case body 50 of the smoothing capacitor module 14 is provided with the insertion opening 56 through which the capacitor unit 54 is inserted, and also the fastening bolt holes 58 for the heat sink 12 are provided in parallel to the depth direction of the insertion opening 56. According to this construction, the depth direction of the insertion opening 56 provided to the case body 50 and the penetration direction of the bolt holes 58 are parallel to each other, so that the metal mold used to perform the metal molding processing of the case body 50 is simplified, and thus the manufacturing cost can be suppressed.

According to this embodiment, the case body 50 is provided with the positioning and holding projecting portion 57 which projects in parallel to the depth direction of the insertion opening 56 and is engagedly fitted in the positioning hole 60 provided to the side surface of the heat sink 12. According to this construction, all of the depth direction of the insertion opening 56 of the case body 50, the penetration direction of the penetration holes 58 and the projecting direction of the position and holding projecting portions 57 are parallel to one another. Therefore, the metal mold used in the metal molding processing of the case body 50 can be simplified, and thus the manufacturing cost can be suppressed.

Furthermore, the position and holding projecting portions 57 are provided to the case body 50, so that it is unnecessary to provide a member for temporarily fixing the smoothing capacitor module 14 as a separate member, and thus the manufacturing cost can be further reduced.

The above embodiment is an embodiment of the present invention, and thus any modification and any application can be applied without departing from the subject matter of the present invention.

In the above embodiment, an in-vehicle mount device is exemplified as an example of the power converter, however, the present invention is not limited to this in-vehicle mount device. For example, the power converter may be mounted in an airplane, a ship or the like.

Furthermore, a device for performing DC-to-AC conversion is exemplified as the power converter, however, the present invention is not limited to this device. For example, it may be a device for performing AC-to-DC conversion.

Still furthermore, a three-phase induction motor is exemplified as an example of an electric motor for driving the power converter, however, the present invention is not limited to the three-phase induction motor. For example, the power converter may be driven by connecting the power converter to another electric motor.

What is claimed is:

1. A power converter, comprising:
a switching power module containing a switching element and a driving circuit for driving the switching element;
a smoothing capacitor module for smoothing an input to the switching power module; and
a heat sink for cooling the switching power module, wherein the switching power module is mounted on the heat sink, and the smoothing capacitor module is provided on a side surface of the heat sink,
wherein the smoothing capacitor module comprises an anode and a cathode that are arranged in a vertical direction, the anode is provided with a P bus bar, the cathode is provided with an N bus bar, each of the P bus bar and the N bus bar is provided with a connection terminal unit for connecting to the switching power module, and the connection terminal units are disposed at the middle point between the anode and the cathode.

2. The power converter according to claim 1, wherein the smoothing capacitor module has a capacitor unit and a case body in which the capacitor unit is mounted, the case body is provided with an insertion opening through which the capacitor unit is inserted, and a bolt hole that penetrates in parallel to the depth direction of the insertion opening and through which the smoothing capacitor module is fastened to the heat sink.

3. The power converter according to claim 2, wherein the case body is provided with a positioning and holding projecting member that projects in parallel to the depth direction of the insertion opening and is fitted in a positioning hole formed in a side surface of the heat sink to be held.

4. A power converter, comprising:
a switching power module containing a switching element and a driving circuit for driving the switching element;
a smoothing capacitor module for smoothing an input to the switching power module; and
a heat sink for cooling the switching power module, wherein the switching power module is mounted on the heat sink, and the smoothing capacitor module is provided on a side surface of the heat sink,
wherein the smoothing capacitor module comprises a capacitor unit and a case body in which the capacitor unit is mounted, the case body is provided with an insertion opening through which the capacitor unit is inserted, and a bolt hole that penetrates in parallel to the depth direction of the insertion opening and through which the smoothing capacitor module is fastened to the heat sink, and
wherein the case body is provided with a positioning and holding projecting member that projects in parallel to the depth direction of the insertion opening and is fitted in a positioning hole formed in a side surface of the heat sink to be held.

* * * * *